United States Patent
Katsube

(10) Patent No.: US 12,113,002 B2
(45) Date of Patent: Oct. 8, 2024

(54) PLURALITY OF TRANSISTORS ATTACHED TO A HEAT SINK WITH A PERIPHERY NOTCH

(71) Applicant: Mitsubishi Electric Corporation, Tokyo (JP)

(72) Inventor: Hiroki Katsube, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 220 days.

(21) Appl. No.: 17/557,196

(22) Filed: Dec. 21, 2021

(65) Prior Publication Data
US 2022/0328385 A1 Oct. 13, 2022

(30) Foreign Application Priority Data
Apr. 12, 2021 (JP) ................. 2021-066880

(51) Int. Cl.
*H01L 23/495* (2006.01)
*H01L 23/31* (2006.01)
(Continued)

(52) U.S. Cl.
CPC .... *H01L 23/49568* (2013.01); *H01L 23/3121* (2013.01); *H01L 23/49537* (2013.01);
(Continued)

(58) Field of Classification Search
CPC .......... H01L 23/49568; H01L 23/3121; H01L 23/34; H01L 23/49537; H01L 23/49562;
(Continued)

(56) References Cited

U.S. PATENT DOCUMENTS 11,270,984 B2 * 3/2022 Arai .................. H01L 23/49562
11,694,948 B2 * 7/2023 Sakai .................... H01L 24/37
257/675

(Continued)

FOREIGN PATENT DOCUMENTS

JP 2015-185834 A 10/2015
JP 2016-134591 A 7/2016

OTHER PUBLICATIONS

Chinese Office Action dated Jul. 23, 2024 in Application No. 202210322268.1.

*Primary Examiner* — Alonzo Chambliss
(74) *Attorney, Agent, or Firm* — Sughrue Mion, PLLC; Richard C. Turner

(57) ABSTRACT

This semiconductor device includes: a heat dissipation plate formed in a plate shape; a plurality of switching elements joined to one surface of the heat dissipation plate; a first terminal extending in a direction away from the heat dissipation plate in a state of being apart from the heat dissipation plate, the first terminal being connected via a first electric conductor to surfaces of the plurality of switching elements on an opposite side to the heat dissipation plate side; and a sealing member sealing the plurality of switching elements, the heat dissipation plate, and the first terminal. A notch is provided in an outer periphery portion of the heat dissipation plate. A portion of the first terminal on the heat dissipation plate side overlaps with a region of a cut at the notch as seen in a direction perpendicular to the one surface of the heat dissipation plate.

10 Claims, 11 Drawing Sheets

(51) Int. Cl.
*H01L 23/34* (2006.01)
*H01L 23/00* (2006.01)
*H01L 25/07* (2006.01)

(52) U.S. Cl.
CPC ........ *H01L 23/34* (2013.01); *H01L 23/49513* (2013.01); *H01L 23/49562* (2013.01); *H01L 23/49575* (2013.01); *H01L 24/29* (2013.01); *H01L 24/32* (2013.01); *H01L 24/37* (2013.01); *H01L 24/40* (2013.01); *H01L 24/49* (2013.01); *H01L 24/84* (2013.01); *H01L 25/072* (2013.01); *H01L 2224/29139* (2013.01); *H01L 2224/32245* (2013.01); *H01L 2224/40175* (2013.01); *H01L 2924/1305* (2013.01); *H01L 2924/181* (2013.01)

(58) Field of Classification Search
CPC ..... H01L 23/3107; H01L 24/40; H01L 24/49; H01L 24/37; H01L 24/84; H01L 25/072; H01L 2224/40175; H01L 2924/181; H01L 2924/1305
See application file for complete search history.

(56) References Cited

U.S. PATENT DOCUMENTS

| | | |
|---|---|---|
| 2017/0110395 A1 | 4/2017 | Iwabuchi et al. |
| 2020/0135607 A1 | 4/2020 | Tsuchiya et al. |
| 2022/0328384 A1* | 10/2022 | Sakai ................. H01L 23/49524 |
| 2023/0154820 A1* | 5/2023 | Yamane .................. H01L 25/07 257/707 |

* cited by examiner

PLURALITY OF TRANSISTORS ATTACHED TO A HEAT SINK WITH A PERIPHERY NOTCH

BACKGROUND OF THE INVENTION

1. Field of the Invention

The present disclosure relates to a semiconductor device.

2. Description of the Background Art

Electrically-driven vehicles such as electric automobiles and plug-in hybrid automobiles are provided with power conversion devices for converting power from a high-voltage battery. A semiconductor device for converting power through a switching operation is used for each power conversion device.

The semiconductor device has a semiconductor switching element joined to a metal plate having heat dissipation properties. The semiconductor switching element is, by means such as direct lead bonding (DLB) or wire bonding, connected to: a main terminal that forms a power circuit for power conversion; and a control terminal connected to a control circuit that controls switching. The semiconductor switching element is sealed with a sealing member such as resin or gel, and a sealing portion is formed so as to enclose the semiconductor switching element. A semiconductor device has been disclosed in which a main terminal and a control terminal corresponding to a same semiconductor switching element protrude from one protrusion surface of a sealing portion and are arranged side by side along the protrusion surface (see, for example, Patent Document 1).

In the disclosed semiconductor device, a main electrode on the back surface of the semiconductor element and the main terminal are electrically connected to each other via a heat dissipation plate connected to the main electrode of the semiconductor element. Meanwhile, the control terminal is connected to a control electrode of the semiconductor element via a bonding wire. The main terminal and the control terminal protrude from the one protrusion surface of the sealing portion and are arranged side by side along the protrusion surface.

Patent Document 1: Japanese Laid-Open Patent Publication No. 2015-185834

In the structure of the semiconductor device in the above Patent Document 1, a bonding tool is pressed against the upper surface of the control terminal in a wire bonding step of connecting the control terminal and the control electrode of the semiconductor element to each other. Thus, the lower surface side of the control terminal is supported with a jig. Therefore, the semiconductor element and the control terminal are sealed with resin such that the control terminal is disposed in a state of not overlapping with the heat dissipation plate, i.e., such that the control terminal is disposed at a location that is offset from the outer periphery of the heat dissipation plate. Accordingly, the contour of the sealing portion and an end portion of the control terminal that is exposed from the sealing portion, are enlarged correspondingly to the offset of the control terminal. Consequently, a problem arises in that the semiconductor device upsizes in a direction in which the control terminal protrudes. In addition, the current path length of the semiconductor device increases in association with the upsizing of the semiconductor device, and thus another problem arises in that the circuit inductance of the semiconductor device increases.

Meanwhile, if the heat dissipation plate and the control terminal are disposed in a state of overlapping with each other, upsizing of the semiconductor device in the direction in which the control terminal protrudes, can be suppressed. However, in addition to a conventional jig for supporting the control terminal, a support member for support between the heat dissipation plate and the control terminal needs to be used in the wire bonding step, and thus a problem arises in that the wire bonding step is complicated.

SUMMARY OF THE INVENTION

Considering this, an object of the present disclosure is to obtain a semiconductor device that suppresses upsizing and increase in the circuit inductance thereof without complicating a wire bonding step.

A semiconductor device according to the present disclosure includes: a heat dissipation plate formed in a plate shape; a plurality of switching elements joined to one surface of the heat dissipation plate; a first terminal extending in a direction away from the heat dissipation plate in a state of being apart from the heat dissipation plate, the first terminal being connected via a first electric conductor to surfaces of the plurality of switching elements on an opposite side to the heat dissipation plate side; and a sealing member sealing the plurality of switching elements, the heat dissipation plate, and the first terminal, wherein a notch is provided in an outer periphery portion of the heat dissipation plate, and a portion of the first terminal on the heat dissipation plate side overlaps with a region of a cut at the notch as seen in a direction perpendicular to the one surface of the heat dissipation plate.

The semiconductor device according to the present disclosure includes the first terminal extending, in the state of being apart from the heat dissipation plate formed in a plate shape, in the direction away from the heat dissipation plate, the first terminal being connected via the first electric conductor to the surfaces of the plurality of switching elements on the opposite side to the heat dissipation plate side, wherein the notch is provided in the outer periphery portion of the heat dissipation plate, and a portion of the first terminal on the heat dissipation plate side overlaps with the region of the cut at the notch as seen in the direction perpendicular to the one surface of the heat dissipation plate. Consequently, the first terminal can be disposed inward of an outer periphery of the heat dissipation plate that does not have any notch, without using any new support member in a wire bonding step. Thus, upsizing of the semiconductor device in the direction in which the first terminal extends, can be suppressed without complicating the wire bonding step. In addition, since the first terminal is disposed inward of the outer periphery of the heat dissipation plate that does not have any notch, the current path length of the semiconductor device is shortened, whereby increase in the circuit inductance of the semiconductor device can be suppressed.

DETAILED DESCRIPTION OF THE PREFERRED EMBODIMENTS OF THE INVENTION

Figure 1:
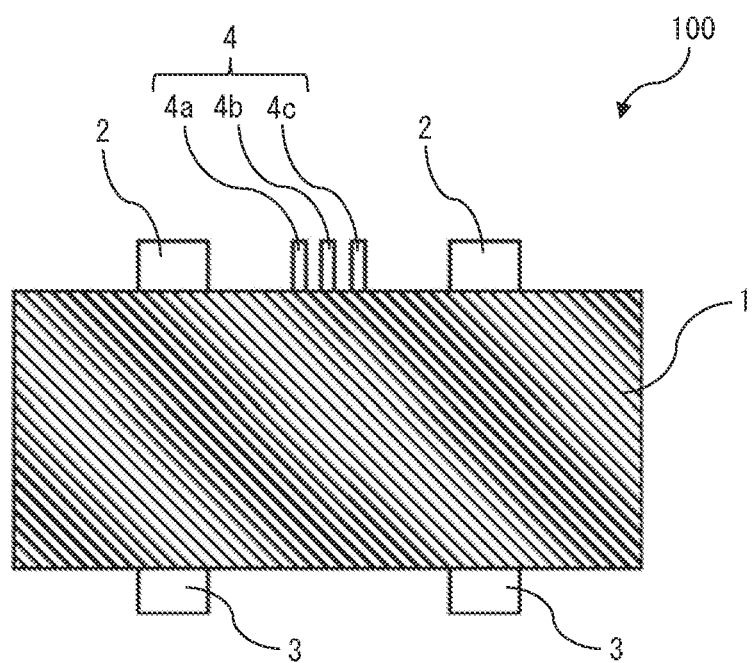
FIG. 1 is a top view showing the outer appearance of a semiconductor device according to a first embodiment.

Hereinafter, semiconductor devices according to embodiments of the present disclosure will be described with reference to the drawings. Description will be given while the same or corresponding members and portions in the drawings are denoted by the same reference characters.

First Embodiment

Figure 2:
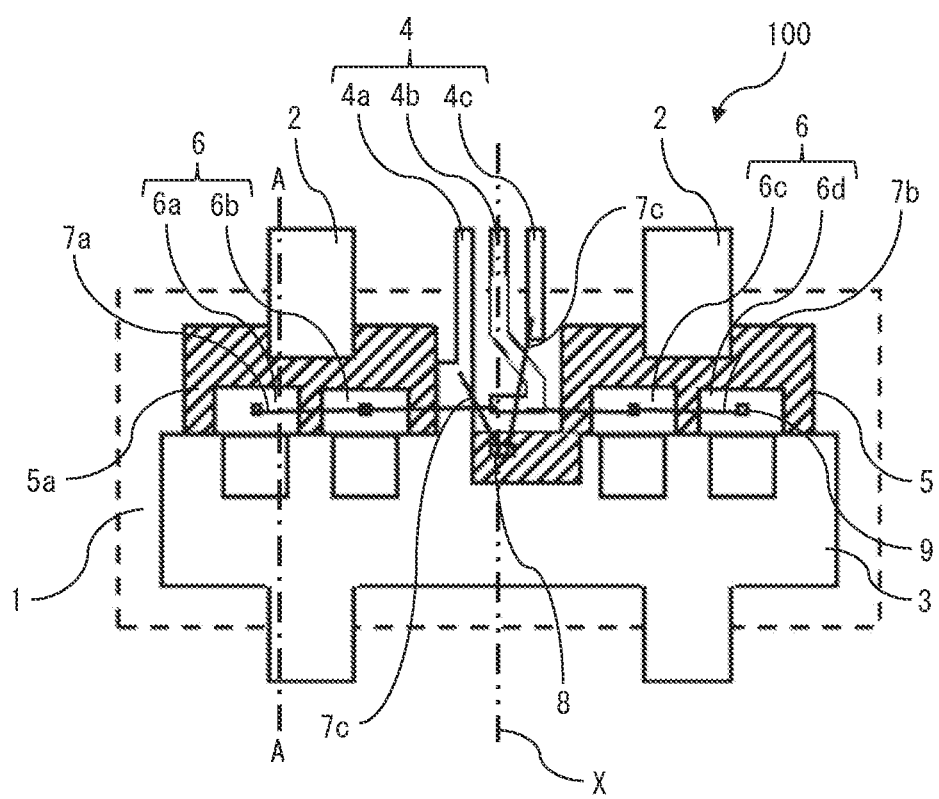
FIG. 2 is a plan view showing a schematic configuration of the semiconductor device according to the first embodiment.
Figure 3:
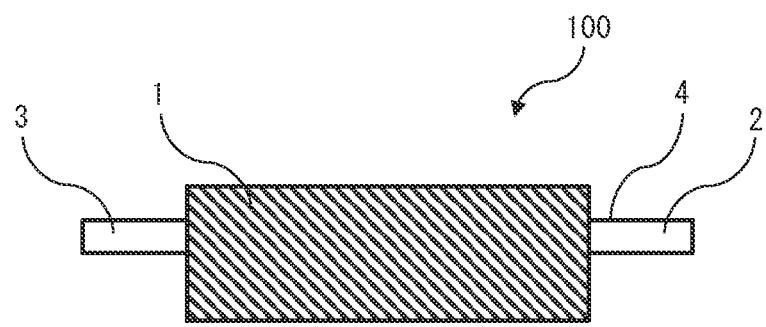
FIG. 3 is a side view showing the outer appearance of the semiconductor device according to the first embodiment.
Figure 4:
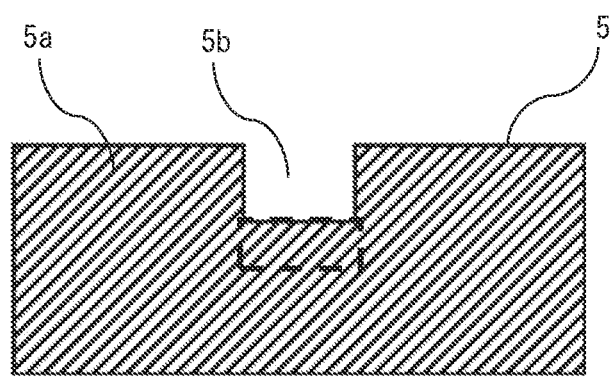
FIG. 4 is a schematic plan view of a heat dissipation plate of the semiconductor device according to the first embodiment.
Figure 5:
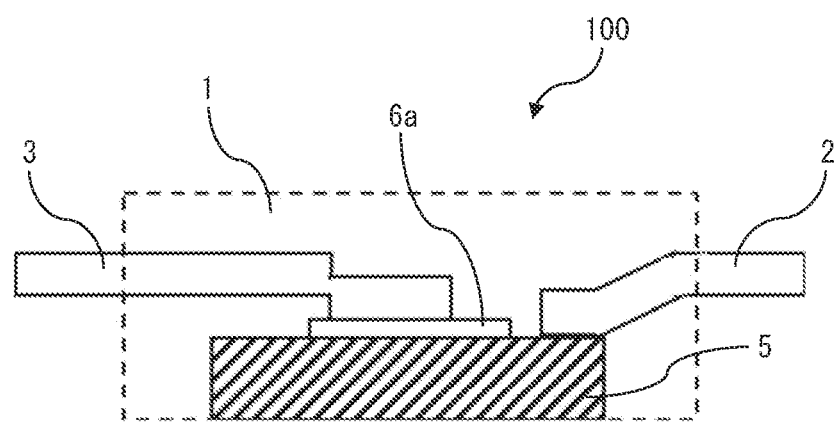
FIG. 5 is a schematic cross-sectional view of the semiconductor device taken at the cross-sectional position A-A in FIG. 2.

FIG. 1 is a top view showing the outer appearance of a semiconductor device 100 according to a first embodiment. FIG. 2 is a plan view showing a schematic configuration of the semiconductor device 100. FIG. 3 is a side view showing the outer appearance of the semiconductor device 100. FIG. 4 is a schematic plan view of a heat dissipation plate 5 of the semiconductor device 100. FIG. 5 is a schematic cross-sectional view of the semiconductor device 100 taken at the cross-sectional position A-A in FIG. 2. FIG. 2 is a view excluding a mold resin 1 which is a sealing member, and the broken line indicates the contour of the mold resin 1. The semiconductor device 100 has a plurality of switching elements 6 and converts power through switching operations.

<Semiconductor Device 100>

As shown in FIG. 1, the semiconductor device 100 is provided with P terminals 2 and an N terminal 3 which are main terminals, and control terminals 4, such that these terminals are exposed from the mold resin 1 to outside. In the present embodiment, the P terminals 2 and the control terminals 4 are exposed to outside from a same side surface of the mold resin 1, and the N terminal 3 is exposed from a side surface thereof on an opposite side to the side surface from which the P terminals 2 and the control terminals 4 are exposed. The side surfaces from which the terminals are exposed are not limited thereto. These terminals are connected to external devices. In the present embodiment, the semiconductor device 100 is provided with three control terminals 4. The three control terminals 4 are: a gate terminal 4b which is a first terminal; a sense terminal 4c which is a second terminal; and a sense source terminal 4a. The mold resin 1 is formed in a rectangular parallelepiped shape, but the shape of the mold resin 1 is not limited thereto. As shown in FIG. 3, the terminals are exposed, at the same height, from the side surfaces of the mold resin 1. It is noted that the terminals may be provided at different heights according to the arrangement of terminals of the external devices to be connected, or the like.

As shown in FIG. 2, the semiconductor device 100 includes: the heat dissipation plate 5 formed in a plate shape; the plurality of switching elements 6 joined to an element-mounted surface 5a which is one surface of the heat dissipation plate 5; the P terminals 2; the N terminal 3; the control terminals 4; and the mold resin 1 sealing the plurality of switching elements 6, the heat dissipation plate 5, the P terminals 2, the N terminal 3, and the control terminals 4. In the present embodiment, the semiconductor device 100 is formed through transfer molding. However, the present disclosure is not limited thereto, and a sealing member such as gel may be used. In the case where the sealing is performed by using gel, a configuration is employed in which, for example, the gel is injected into a resin case accommodating the switching elements 6 and the like.

The heat dissipation plate 5 shown in FIG. 4 is made of a metal such as copper or aluminum with electrical conductivity as well as excellent thermal conductivity so as to have a rectangular shape. The heat dissipation plate 5 is, for example, a heat spreader made of copper. The material and the shape of the heat dissipation plate 5 are not limited thereto. The heat dissipation plate 5 may be made of another substrate material such as a direct bonded copper (DBC) substrate obtained by joining, to a base plate made of copper, a ceramic insulating substrate which is an insulating material to which metal foil has been joined through brazing or the like. The heat dissipation plate 5 and the switching elements 6 are electrically and thermally joined together through, for example, solder. The material for the joining between the heat dissipation plate 5 and the switching elements 6 is not limited to solder and only has to be a material that is characterized by having a high thermal conductivity and a low electrical resistance. The material may be, for example, a paste material that contains silver as a main component. Heat generated from each switching element 6 is diffused to outside through the heat dissipation plate 5, and thus the switching element 6 is effectively cooled. A notch 5b, of the heat dissipation plate 5, which is a major part of the present disclosure will be described later.

The switching elements 6 include four switching elements 6a, 6b, 6c, and 6d. As each switching element 6, a power control semiconductor element such as a metal oxide semiconductor field effect transistor (MOSFET) or an insulated gate bipolar transistor (IGBT), a flyback diode, or the like, is used. The switching element 6 is not limited thereto and may be another switching element such as a bipolar transistor. The present embodiment employs a configuration in which: an MOSFET is used; and a parasitic diode of the MOSFET is used as a flyback diode. However, in the case of, for example, using a switching element having no parasitic diode such as an IGBT, a configuration in which a flyback diode is provided in parallel may be employed. The switching element 6 is formed on a semiconductor substrate made from a material such as silicon carbide, silicon, or gallium nitride.

As shown in FIG. 2, the semiconductor device 100 includes a sense element 8 disposed on the element-mounted surface 5a of the heat dissipation plate 5 adjacently to the notch 5b. The sense element 8 measures a temperature around the switching elements 6 via the heat dissipation plate 5. Through the measurement of the temperature around the switching elements 6 by the sense element 8, increase in the temperature of each switching element 6 can be suppressed. The sense element 8 is, for example, a thermistor. The sense element 8 is connected to the sense terminal 4c and the sense source terminal 4a via bonding wires 7c as bonding members which are second electric conductors.

<Terminals>

Each of the terminals, i.e., the P terminals 2, the N terminal 3, and the control terminals 4, is made of a metal such as copper or aluminum having electrical conductivity. One side of each P terminal 2 is joined to the element-mounted surface 5a of the heat dissipation plate 5, and another side of the P terminal 2 is exposed to the outside of the mold resin 1 and connected to another device on the outside. One side of the N terminal 3 is joined to an electrode provided on a surface of each switching element 6 on an opposite side to the heat dissipation plate 5 side, and another side of the N terminal 3 is exposed to the outside of the mold resin 1 and connected to another device on the outside. The sense source terminal 4a is an extending portion of the N terminal 3 that extends from a body portion of the N terminal 3 to an opposite side to portions of the N terminal 3 that are exposed to the outside. The sense source terminal 4a is at the same potential as the potential of the N terminal 3. In the present embodiment, the sense source terminal 4a and the N terminal 3 are integrated with each other. However, a configuration may be employed in which the sense source terminal 4a and the N terminal 3 are separately provided and connected to each other by a bonding wire or the like. Further, as shown in FIG. 5, portions of the P terminals 2 and the N terminal 3 in the present embodiment that are connected inside the mold resin 1 are depressed to the connection side such that the portions of the P terminals 2 and the N terminal 3 that are exposed to the outside of the mold resin 1 have the same height.

The gate terminal 4b extends in a direction away from the heat dissipation plate 5 in a state of being apart from the heat dissipation plate 5 and is connected to surfaces of the plurality of switching elements 6 on the opposite side to the heat dissipation plate 5 side, via a bonding wire 7a and a bonding wire 7b as bonding members which are first electric conductors. The connected portions of the switching elements 6 are gate electrodes 9 of the respective switching elements 6. The sense terminal 4c extends in the direction away from the heat dissipation plate 5 in the state of being apart from the heat dissipation plate 5 and is connected to the sense element 8 via the bonding wire 7c. The bonding wires 7a, 7b, and 7c are wires made of, for example, aluminum. However, the bonding wires are not limited thereto and may be other electric conductors such as ribbons made of copper. If bonding members are used as one or both of each first electric conductor and each second electric conductor, the electric conductor can be formed so as to have a small cross-sectional area as compared to DLB, whereby the semiconductor device 100 can be downsized.

The P terminals 2 joined to the element-mounted surface 5a are connected via the heat dissipation plate 5 to electrodes provided on surfaces of the switching elements 6 on the heat dissipation plate 5 side. As described above, the N terminal 3 is connected to the electrodes provided on the surfaces of the switching elements 6 on the opposite side to the heat dissipation plate 5 side. By these connections, the switching elements 6 are electrically connected in parallel between the drain electrodes thereof and between the source electrodes thereof, and one set of arms are formed.

<Notch 5b>

As shown in FIG. 4, the notch 5b is provided in an outer periphery portion of the heat dissipation plate 5. The notch 5b is a portion obtained by inward cutting from an outer periphery of the heat dissipation plate 5. In the present embodiment, the notch 5b is formed in a rectangular shape. However, the shape of the notch 5b is not limited thereto, and the notch 5b may be a portion enclosed by a curve. In the case where the heat dissipation plate 5 is made through press working, the notch 5b can be formed simultaneously with the press working. After the heat dissipation plate 5 is made, a portion of the heat dissipation plate 5 may be removed through cutting processing or the like, to form the notch 5b.

A portion of the gate terminal 4b on the heat dissipation plate 5 side overlaps with a region of a cut at the notch 5b as seen in a direction perpendicular to the element-mounted surface 5a of the heat dissipation plate 5. A portion of the sense terminal 4c on the heat dissipation plate 5 side overlaps with the region of the cut at the notch 5b as seen in the direction perpendicular to the element-mounted surface 5a of the heat dissipation plate 5.

By this configuration, the gate terminal 4b and the sense terminal 4c can be disposed inward of an outer periphery of the heat dissipation plate that does not have any notch 5b. Thus, upsizing of the semiconductor device 100 in the direction in which the gate terminal 4b and the sense terminal 4c extend, can be suppressed. In a wire bonding step, the gate terminal 4b and the sense terminal 4c can be supported with a jig in the region of the notch 5b, and thus there is no need for support between the heat dissipation plate 5 and each of the gate terminal 4b and the sense terminal 4c. Since no new support member for support between the heat dissipation plate 5 and each of the gate terminal 4b and the sense terminal 4c needs to be used in the wire bonding step, the wire bonding step is not complicated. In addition, the gate terminal 4b and the sense terminal 4c can be easily disposed on the same plane as the plane of the element-mounted surface 5a. In addition, since the gate terminal 4b is disposed inward of the outer periphery of the heat dissipation plate that does not have any notch 5b, the current path length of the semiconductor device 100 is shortened, whereby increase in the circuit inductance of the semiconductor device 100 can be suppressed.

In addition, the volume of the heat dissipation plate 5 is reduced correspondingly to the notch 5b, and a portion around the notch 5b is filled with the mold resin 1 having a lower density than the material used for the heat dissipation plate 5, whereby the weight of the semiconductor device 100 can be reduced. In addition, provision of the notch 5b makes it possible to suppress warpage caused by the difference in linear expansion coefficient among members. In addition, the area of contact between the mold resin 1 and the heat dissipation plate 5 increases, whereby adhesion between the mold resin 1 and the heat dissipation plate 5 can be improved.

<Arrangement of Switching Elements 6>

The plurality of switching elements 6 are arranged in a row so as to straddle the notch 5b, in both-side regions straddling the notch 5b on the element-mounted surface 5a of the heat dissipation plate 5. In the present embodiment, the plurality of switching elements 6 are arranged in a row along a long side of the heat dissipation plate 5 having a rectangular shape. Each of the switching elements 6a and 6b, and each of the switching elements 6c and 6d, are respectively disposed in a one-side region and an other-side region straddling the notch 5b on the element-mounted surface 5a of the heat dissipation plate 5. By this configuration, the switching elements 6 are disposed apart in the one-side region and the other-side region straddling the notch 5b, and thus heat interferences from the switching elements 6 disposed in the different regions are less likely to be received. Since heat interferences from the switching elements 6 disposed in the different regions are less likely to be received, heat dissipation properties of the switching elements 6 can be improved.

The gate electrodes 9, and the portions of the gate terminal 4b that are connected to the bonding wire 7a and the bonding wire 7b, are arranged in a row in a direction parallel to the element-mounted surface 5a of the heat dissipation plate 5. By this configuration, the plurality of switching elements 6 can be disposed close to each other, and the lengths of the bonding wire 7a and the bonding wire 7b can be shortened. Since the lengths of the bonding wire 7a and the bonding wire 7b can be shortened, productivity for the semiconductor device 100 can be improved.

In each of the one-side region and the other-side region straddling the notch 5b on the element-mounted surface 5a of the heat dissipation plate 5, the bonding wire 7a or the bonding wire 7b makes connection between the gate electrodes 9 of the two respective switching elements 6 adjacent to each other. The bonding wire 7a makes connection between the gate terminal 4b and the gate electrode 9 of one of the switching elements 6b that is disposed in the one-side region adjacently to the notch 5b. The bonding wire 7b makes connection between the gate terminal 4b and the gate electrode 9 of one of the switching elements 6c that is disposed in the other-side region adjacently to the notch 5b. The present embodiment shows an example in which the gate electrodes 9 are connected in parallel to the gate terminal 4b in this manner through stitch bonding. The bonding wire 7a is a stitch wire connecting the gate terminal 4b and the switching elements 6a and 6b disposed in the one-side region. The bonding wire 7b is a stitch wire connecting the gate terminal 4b and the switching elements 6c and 6d disposed in the other-side region in an opposed manner.

By this configuration, the gate terminal 4b connected to the plurality of switching elements 6 can be disposed in the region of the notch 5b so as to be close to the plurality of switching elements 6. Since the gate terminal 4b can be disposed in the region of the notch 5b so as to be close to the plurality of switching elements 6, the semiconductor device 100 can be downsized. In addition, the bonding wires 7a and 7b substantially linearly extend along the direction of arrangement of the switching elements 6, and a low-loop and short-wire arrangement is achieved. Thus, a short-circuit failure due to deformation of the bonding wire 7a, 7b is less likely to occur in a resin sealing step, whereby productivity for the semiconductor device 100 can be improved. Although the present embodiment shows an example in which the gate electrodes 9 are connected in parallel to the gate terminal 4b through stitch bonding, the present disclosure is not limited thereto, and the gate electrodes 9 and the gate terminal 4b may be connected with different wires.

The switching elements 6a and 6b disposed in the one-side region and the switching elements 6c and 6d disposed in the other-side region are disposed so as to be symmetric about a first baseline X perpendicular to the direction of arrangement of the switching elements 6 as seen in the direction perpendicular to the element-mounted surface 5a of the heat dissipation plate 5. By this configuration, the bonding wires 7a and 7b have the same length, and variation among control signals due to the lengths of the wires can be suppressed.

In the present embodiment, two switching elements 6 are disposed in each of the one-side region and the other-side region. However, the number of the switching elements 6 to be disposed is not limited thereto, and one switching element 6 or three or more switching elements 6 may be disposed in each region. Further, although the four switching elements 6 are connected in parallel per arm, the number of the switching elements 6 in parallel is not limited to four. Further, although the gate electrodes 9 of the plurality of respective switching elements 6 are connected to the one gate terminal 4b, a configuration may be employed in which: a plurality of gate terminals 4b are disposed; and each of the gate terminals 4b is connected to any of the gate electrodes 9.

<Disposition of Sense Element 8>

In the present embodiment, the sense element 8 is disposed in a region that is adjacent to the notch 5b and that is interposed between the one-side region and the other-side region. If the heat dissipation plate 5 is a heat dissipation plate 5 shown in FIG. 4, the region that is adjacent to the notch 5b and that is interposed between the one-side region and the other-side region refers to a region enclosed by the broken line in FIG. 4. By this configuration, the sense element 8 and the switching elements 6 can be disposed close to each other, and the bonding wires 7a, 7b, and 7c can be disposed so as to concentrate around the control terminals 4. Therefore, the semiconductor device 100 can be downsized. In addition, productivity for the semiconductor device 100 can be improved.

As described above, the semiconductor device 100 according to the first embodiment includes the gate terminal 4b extending in the direction away from the heat dissipation plate 5 in the state of being apart from the heat dissipation plate 5 formed in a plate shape, the gate terminal 4b being connected via the first electric conductors to the surfaces of the plurality of switching elements 6 on the opposite side to the heat dissipation plate 5 side, wherein the notch 5b is provided in the outer periphery portion of the heat dissipation plate 5, and the portion of the gate terminal 4b on the heat dissipation plate 5 side overlaps with the region of the cut at the notch 5b as seen in the direction perpendicular to the element-mounted surface 5a of the heat dissipation plate 5. Consequently, the gate terminal 4b can be disposed inward of the outer periphery of the heat dissipation plate 5 that does not have any notch 5b, without using any new support member in the wire bonding step. Thus, upsizing of the semiconductor device 100 in the direction in which the gate terminal 4b extends, can be suppressed without complicating the wire bonding step. In addition, since the gate terminal 4b is disposed inward of the outer periphery of the heat dissipation plate that does not have any notch 5b, the current path length of the semiconductor device 100 is shortened, whereby increase in the circuit inductance of the semiconductor device 100 can be suppressed.

If the portion on the heat dissipation plate 5 side of the sense terminal 4c connected to the sense element 8 disposed adjacently to the notch 5b overlaps with the region of the cut at the notch 5b as seen in the direction perpendicular to the element-mounted surface 5a of the heat dissipation plate 5, the sense terminal 4c can be disposed inward of the outer periphery of the heat dissipation plate 5 that does not have any notch 5b, without using any new support member in the wire bonding step. Thus, upsizing of the semiconductor device 100 in the direction in which the sense terminal 4c extends, can be suppressed without complicating the wire bonding step. Further, if the plurality of switching elements 6 are arranged in a row so as to straddle the notch 5b, in the both-side regions straddling the notch 5b on the element-mounted surface 5a of the heat dissipation plate 5, the switching elements 6 are disposed apart in the one-side region and the other-side region straddling the notch 5b, and thus heat interferences from the switching elements 6 disposed in the different regions can be made less likely to be received.

If each of the plurality of switching elements 6 has the gate electrode 9 on the surface thereof on the opposite side to the heat dissipation plate 5 side, the gate terminal 4b and the gate electrode 9 are connected to each other via the bonding wire 7a or the bonding wire 7b, and the gate electrode 9 and portions of the gate terminal 4b that are connected to the bonding wire 7a and the bonding wire 7b are arranged in a row in the direction parallel to the element-mounted surface 5a of the heat dissipation plate 5, the plurality of switching elements 6 can be disposed close to each other, whereby the lengths of the bonding wire 7a and the bonding wire 7b can be shortened. Further, if, in each of the one-side region and the other-side region straddling the notch 5b on the element-mounted surface 5a of the heat dissipation plate 5, the bonding wire 7a or the bonding wire 7b makes connection between the gate electrodes 9 of the two respective switching elements 6 adjacent to each other, and the bonding wire 7a or the bonding wire 7b makes connection between the gate terminal 4b and each of the gate electrode 9 of one of the switching elements 6b that is disposed in the one-side region adjacently to the notch 5b and the gate electrode 9 of one of the switching elements 6c that is disposed in the other-side region adjacently to the notch 5b, the gate terminal 4b connected to the plurality of switching elements 6 can be disposed in the region of the notch 5b so as to be close to the plurality of switching elements 6. Since the gate terminal 4b can be disposed in the region of the notch 5b so as to be close to the plurality of switching elements 6, the semiconductor device 100 can be downsized.

Second Embodiment

Figure 6:
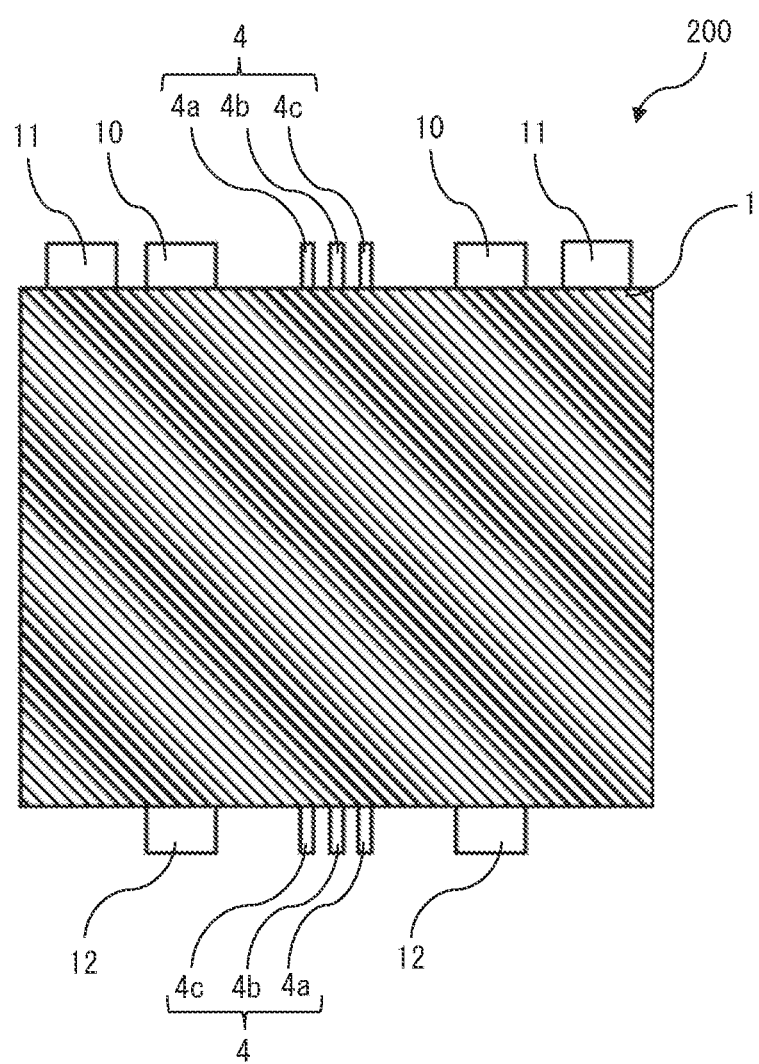
FIG. 6 is a top view showing the outer appearance of a semiconductor device according to a second embodiment.
Figure 7:
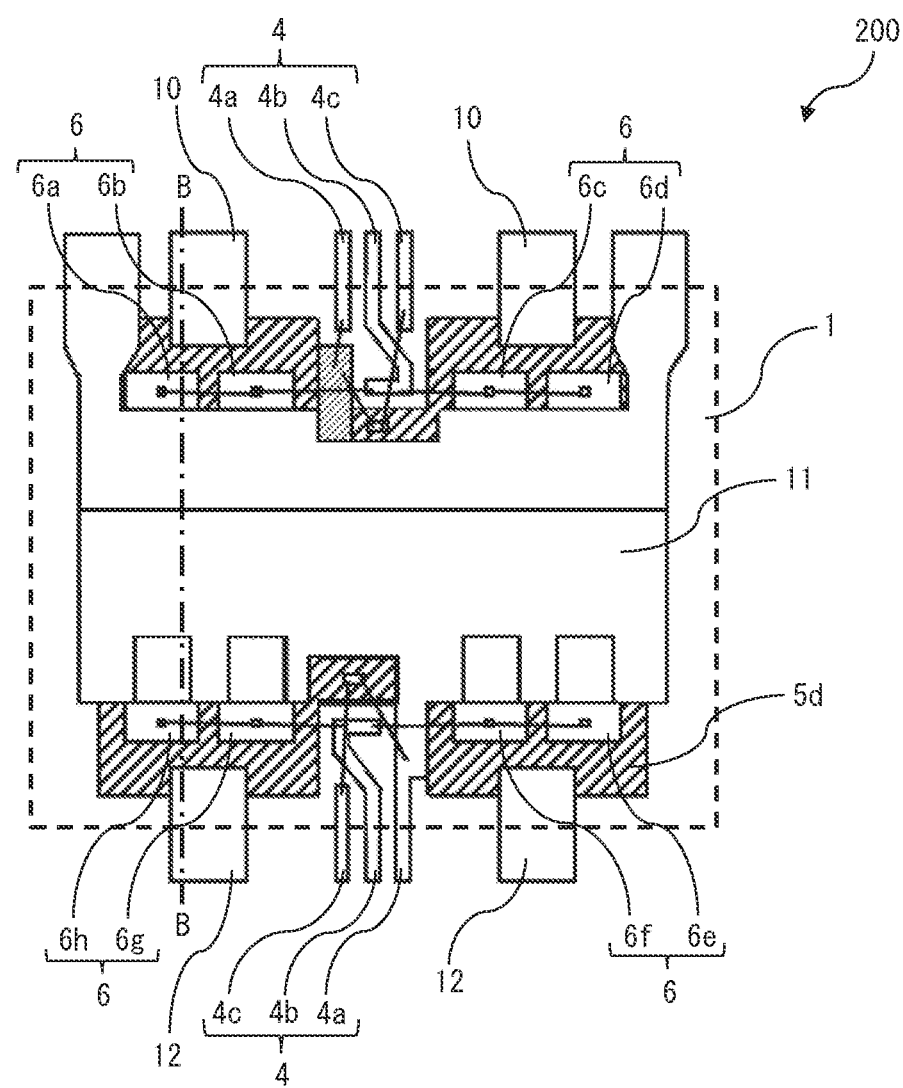
FIG. 7 is a plan view showing a schematic configuration of the semiconductor device according to the second embodiment.
Figure 8:
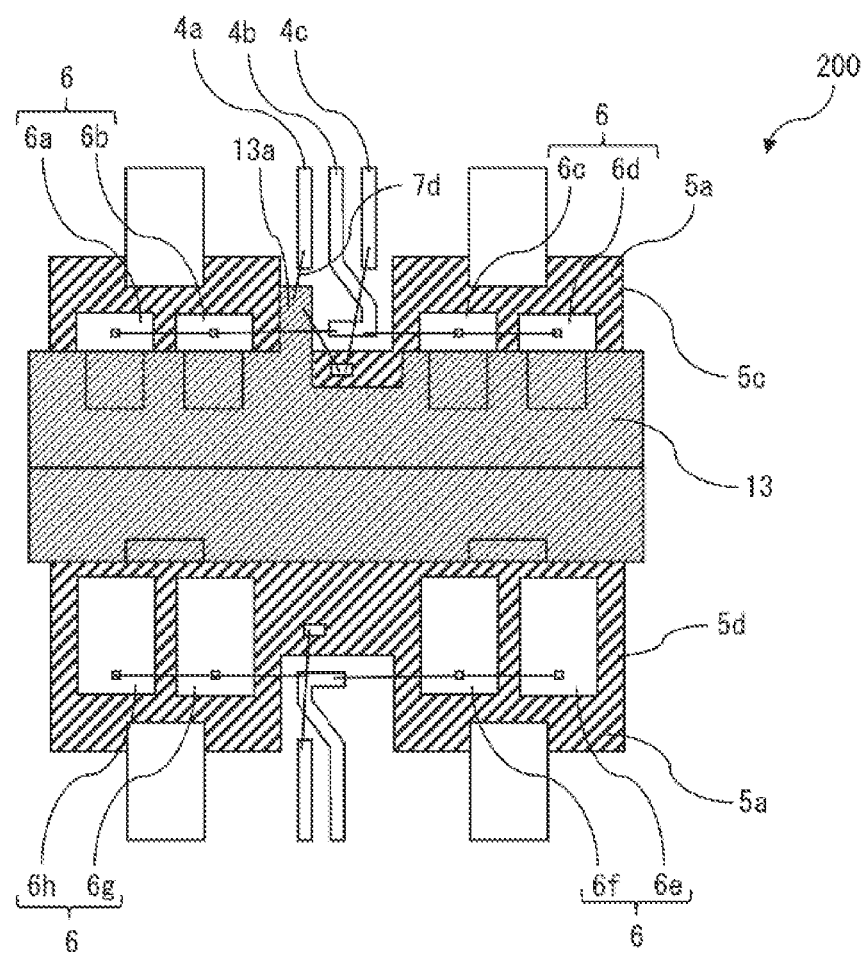
FIG. 8 is another plan view showing the schematic configuration of the semiconductor device according to the second embodiment.
Figure 9:
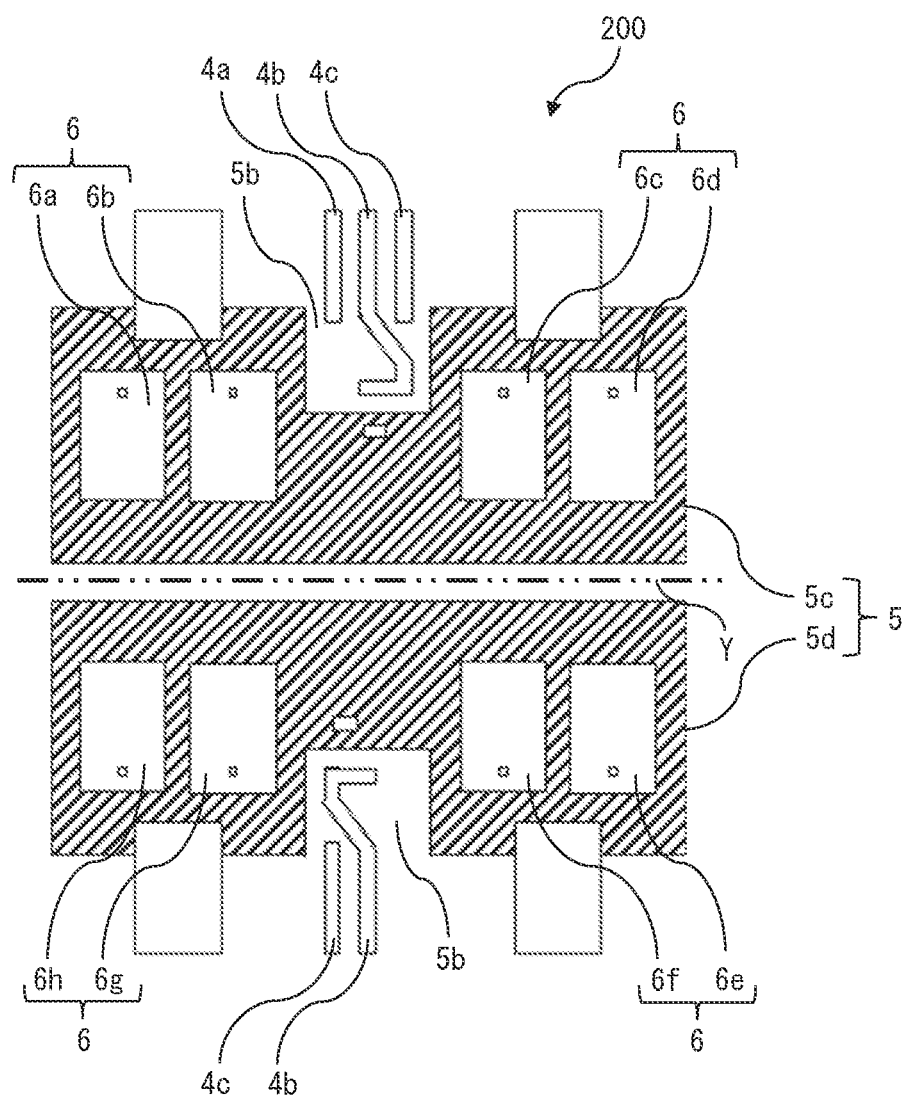
FIG. 9 is another plan view showing the schematic configuration of the semiconductor device according to the second embodiment.
Figure 10:
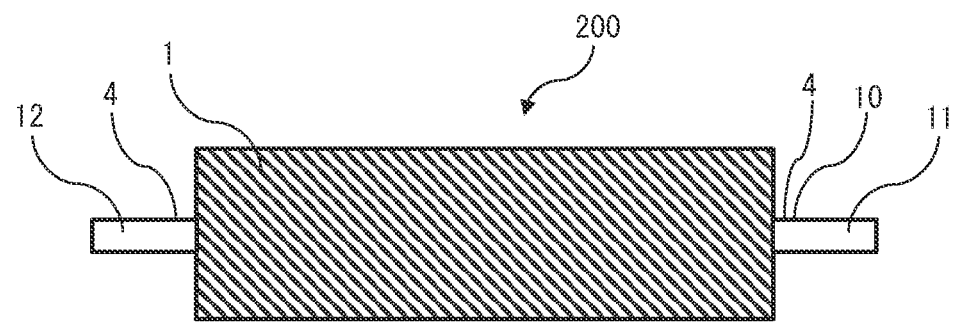
FIG. 10 is a side view showing the outer appearance of the semiconductor device according to the second embodiment.
Figure 11:
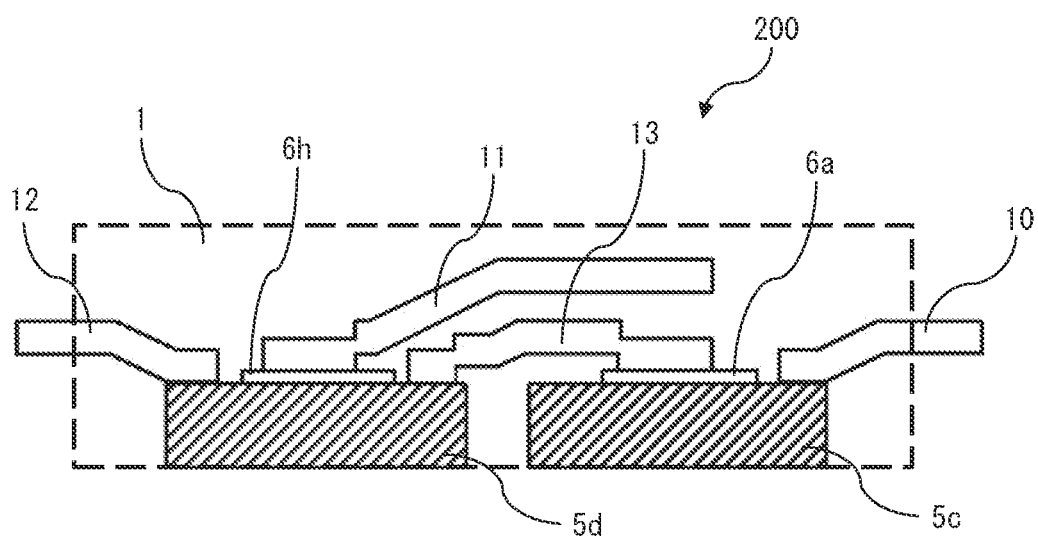
FIG. 11 is a schematic cross-sectional view of the semiconductor device taken at the cross-sectional position B-B in FIG. 7.

A semiconductor device 200 according to a second embodiment will be described. FIG. 6 is a top view showing the outer appearance of the semiconductor device 200 according to the second embodiment. FIG. 7 is a plan view showing a schematic configuration of the semiconductor device 200, excluding the mold resin 1. FIG. 8 is a plan view showing the schematic configuration of the semiconductor device 2000, excluding a negative-arm N terminal 11 from FIG. 7. FIG. 9 is a plan view showing the schematic configuration of the semiconductor device 200, excluding an inner lead 13 from FIG. 8. FIG. 10 is a side view showing the outer appearance of the semiconductor device 200. FIG. 11 is a schematic cross-sectional view of the semiconductor device 200 taken at the cross-sectional position B-B in FIG. 7. The broken line shown in FIG. 7 indicates the contour of the mold resin 1. The semiconductor device 200 according to the second embodiment has a configuration provided with two sets each composed of a plurality of switching elements 6, a heat dissipation plate 5, a gate terminal 4b, and a sense terminal 4c.

<Semiconductor Device 200>

The semiconductor device 200 includes positive and negative arms each composed of the switching elements 6. The positive arm and the negative arm are connected in series. The positive arm and the negative arm are integrated with each other with the mold resin 1. This is a configuration generally called a 2-in-1 module. Although the 2-in-1 configuration will be described in the present embodiment, the semiconductor device 200 may have a 4-in-1 configuration or a 6-in-1 configuration.

As shown in FIG. 6, in the semiconductor device 200, control terminals 4, and positive-arm P terminals 10, a negative-arm N terminal 11, and AC terminals 12 which are main terminals, are provided so as to be exposed from the mold resin 1 to outside. In the present embodiment, each positive-arm P terminal 10 and the negative-arm N terminal 11 are exposed to outside from the same side surface of the mold resin 1, and each AC terminal 12 is exposed from a side surface thereof on the opposite side to the side surface from which the positive-arm P terminal 10 and the negative-arm N terminal 11 are exposed. The control terminals 4 are provided to both side surfaces. The side surfaces from which the terminals are exposed are not limited thereto. These terminals are connected to external devices. As shown in FIG. 10, the terminals are exposed, at the same height, from the side surfaces of the mold resin 1. It is noted that the terminals may be provided at different heights according to the arrangement of terminals of the external devices to be connected, or the like.

As shown in FIG. 9, the semiconductor device 200 includes the two sets each composed of the plurality of switching elements 6, the heat dissipation plate 5, the gate terminal 4b, and the sense terminal 4c. In FIG. 9, the upper side is defined as a positive arm side indicating a first set, and the lower side is defined as a negative arm side indicating a second set. A heat dissipation plate 5c of the first set and a heat dissipation plate 5d of the second set are disposed adjacent to each other on the same plane. In the present embodiment, the heat dissipation plate 5c of the first set and the heat dissipation plate 5d of the second set are formed in rectangular shapes that have respective long sides facing each other, and the heat dissipation plate 5c of the first set, the heat dissipation plate 5d of the second set, and the plurality of switching elements 6 are disposed so as to be symmetric about a second baseline Y along the long sides. The switching elements 6a, 6b, 6c, and 6d are joined to the heat dissipation plate 5c of the first set, and switching elements 6e, 6f, 6g, and 6h are joined to the heat dissipation plate 5d of the second set. A notch 5b of the heat dissipation plate 5c of the first set is provided in an outer periphery portion of the heat dissipation plate 5c of the first set on an opposite side to the heat dissipation plate 5d of the second set. A notch 5b of the heat dissipation plate 5d of the second set is provided in an outer periphery portion of the heat dissipation plate 5d of the second set on an opposite side to the heat dissipation plate 5c of the first set. The gate terminal 4b and the sense terminal 4c of the first set extend to the opposite side to the heat dissipation plate 5d of the second set. The gate terminal 4b and the sense terminal 4c of the second set extend to the opposite side to the heat dissipation plate 5c of the first set.

Portions of the gate terminals 4b respectively on the side where the heat dissipation plate 5c of the first set is present and the side where the heat dissipation plate 5d of the second set is present, overlap with regions of cuts at the notches 5b as seen in a direction perpendicular to element-mounted surfaces 5a of the heat dissipation plate 5c of the first set and the heat dissipation plate 5d of the second set. Portions of the sense terminals 4c respectively on the side where the heat dissipation plate 5c of the first set is present and the side where the heat dissipation plate 5d of the second set is present, overlap with the regions of the cuts at the notches 5b as seen in the direction perpendicular to the element-mounted surfaces 5a of the heat dissipation plate 5c of the first set and the heat dissipation plate 5d of the second set.

By this configuration, the notches 5b can be formed in both the heat dissipation plate 5c of the first set and the heat dissipation plate 5d of the second set disposed adjacent to each other on the same plane, and thus upsizing of the semiconductor device 200 in the directions in which the gate terminals 4b and the sense terminals 4c extend, can be suppressed. In addition, each gate terminal 4b is disposed inward of an outer periphery of the corresponding heat dissipation plate that does not have any notch 5b. Thus, the current path length of the semiconductor device 200 is shortened, whereby increase in the circuit inductance of the semiconductor device 200 can be suppressed.

<Inner Lead 13>

As shown in FIG. 8, the semiconductor device 200 includes the inner lead 13 and a sense source terminal 4a which is a third terminal. The inner lead 13 connects the element-mounted surface 5a of the heat dissipation plate 5d of the second set and electrodes provided on surfaces of the switching elements 6a, 6b, 6c, and 6d joined to the element-mounted surface 5a of the heat dissipation plate 5c of the first set, the surfaces being located on an opposite side to the side where the heat dissipation plate 5c of the first set is present. The inner lead 13 has an extending portion 13a extending from a body portion of the inner lead 13 to the opposite side to the heat dissipation plate 5d of the second set. The sense source terminal 4a extends in a direction away from the heat dissipation plate 5c of the first set in a state of being apart from the heat dissipation plate 5c of the first set. The element-mounted surface 5a of the heat dissipation plate 5d of the second set is joined to electrodes provided on surfaces of the switching elements 6e, 6f, 6g, and 6h on the side where the heat dissipation plate 5d of the second set is present. The extending portion 13a, and a portion of the sense source terminal 4a on the side where the heat dissipation plate 5c of the first set is present, are each disposed so as to overlap with the region of the notch 5b of the heat dissipation plate 5c of the first set as seen in the direction perpendicular to the element-mounted surface 5a of the heat dissipation plate 5c of the first set, and the extending portion 13a is connected to the sense source terminal 4a via a bonding wire 7d as a bonding member which is a third electric conductor. If a bonding member is used as the third electric conductor, the electric conductor can be formed so as to have a small cross-sectional area as compared to DLB, whereby the semiconductor device 200 can be downsized.

By this configuration, the sense source terminal 4a and the extending portion 13a can be disposed inward of the outer periphery of the heat dissipation plate that does not have any notch 5b. Thus, upsizing of the semiconductor device 200 in the direction in which the sense source terminal 4a and the extending portion 13a extend, can be suppressed. In the wire bonding step, the sense source terminal 4a and the extending portion 13a can be supported with a jig in the region of the notch 5b, and thus there is no need for support between the heat dissipation plate 5 and each of the sense source terminal 4a and the extending portion 13a. Since no new support member for support between the heat dissipation plate 5 and each of the sense source terminal 4a and the extending portion 13a needs to be used in the wire bonding step, the wire bonding step is not complicated. In addition, since the sense source terminal 4a is disposed inward of the outer periphery of the heat dissipation plate that does not have any notch 5b, the current path length of the semiconductor device 200 is shortened, whereby increase in the circuit inductance of the semiconductor device 200 can be suppressed.

<Arm Configuration of Semiconductor Device 200>

The positive and negative arms of the semiconductor device 200 will be described. As shown in FIG. 8, the switching elements 6a, 6b, 6c, and 6d are connected in parallel by the heat dissipation plate 5c of the first set and the inner lead 13, to form the positive arm. As shown in FIG. 7, the switching elements 6e, 6f, 6g, and 6h are connected in parallel by the heat dissipation plate 5d of the second set and the negative-arm N terminal 11, to form the negative arm. The positive-arm P terminal 10 has one side joined to the element-mounted surface 5a of the heat dissipation plate 5c of the first set in the positive arm and has another side exposed to the outside of the mold resin 1 and connected to another device on the outside. The AC terminal 12 has one side joined to the element-mounted surface 5a of the heat dissipation plate 5d of the second set in the negative arm and has another side exposed to the outside of the mold resin 1 and connected to another device on the outside. As shown in FIG. 11, the heat dissipation plate 5d of the second set at a drain potential of the negative arm is connected to the inner lead 13, to be connected to a source potential of the positive arm. The inner lead 13 connects the positive arm and the negative arm. The inner lead 13 and the negative-arm N terminal 11 have a two-layer configuration.

In a manufacturing process for the semiconductor device 200, the terminals exposed from the mold resin 1 shown in FIG. 6 to outside are supported by the same lead frame. After the terminals are sealed with the mold resin 1 in a state of being supported by the lead frame, the terminals are separated from the lead frame. This process is a general manufacturing process for manufacturing semiconductor devices. In the sealing step, the lead frame is held between an upper die and a lower die of a mold for resin molding.

In the present embodiment, the inner lead 13 and the negative-arm N terminal 11 have a two-layer configuration. In the two-layer configuration, the inner lead 13 is disposed inside the mold resin 1 in order to avoid interference between the mold for resin molding and each of the inner lead 13 and the negative-arm N terminal 11. Thus, although the sense source terminal 4a for the positive arm is at the same potential as the source potential of each of the switching elements 6a, 6b, 6c, and 6d, the sense source terminal 4a needs to be separated from the inner lead 13. Therefore, a configuration is employed in which the inner lead 13 and the sense source terminal 4a for the positive arm are separately provided and connected to each other by the bonding wire 7d.

As described above, the semiconductor device 200 according to the second embodiment includes the two sets each composed of the plurality of switching elements 6, the heat dissipation plate 5, the gate terminal 4b, and the sense terminal 4c. The heat dissipation plate 5c of the first set and the heat dissipation plate 5d of the second set are disposed adjacent to each other on the same plane. The notch 5b of the heat dissipation plate 5c of the first set is provided in the outer periphery portion of the heat dissipation plate 5c of the first set on the opposite side to the heat dissipation plate 5d of the second set. The notch 5b of the heat dissipation plate 5d of the second set is provided in the outer periphery portion of the heat dissipation plate 5d of the second set on the opposite side to the heat dissipation plate 5c of the first set. The gate terminal 4b and the sense terminal 4c of the first set extend to the opposite side to the heat dissipation plate 5d of the second set. The gate terminal 4b and the sense terminal 4c of the second set extend to the opposite side to the heat dissipation plate 5c of the first set. Thus, since the notches 5b can be formed on both the heat dissipation plate 5c of the first set and the heat dissipation plate 5d of the second set disposed adjacent to each other on the same plane, upsizing of the semiconductor device 200 in the directions in which the gate terminals 4b and the sense terminals 4c extend, can be suppressed.

The inner lead 13 has the extending portion 13a extending from the body portion of the inner lead 13 to the opposite side to the heat dissipation plate 5d of the second set. The sense source terminal 4a extends in the direction away from the heat dissipation plate 5c of the first set in the state of being apart from the heat dissipation plate 5c of the first set. The extending portion 13a, and the portion of the sense source terminal 4a on the side where the heat dissipation plate 5c of the first set is present, are each disposed so as to overlap with the region of the notch 5b of the heat dissipation plate 5c of the first set as seen in the direction perpendicular to the element-mounted surface 5a of the heat dissipation plate 5c of the first set. The extending portion 13a is connected to the sense source terminal 4a via the bonding wire 7d. Thus, the sense source terminal 4a and the extending portion 13a can be disposed inward of the outer periphery of the heat dissipation plate that does not have any notch 5b. Therefore, upsizing of the semiconductor device 200 in the direction in which the sense source terminal 4a and the extending portion 13a extend, can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the technical scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 mold resin
2 P terminal
3 N terminal
4 control terminal
4a sense source terminal
4b gate terminal
4c sense terminal
5 heat dissipation plate
5a element-mounted surface
5b notch
5c heat dissipation plate of first set
5d heat dissipation plate of second set
6 switching element
7a bonding wire
7b bonding wire
7c bonding wire
7d bonding wire
8 sense element
9 gate electrode
10 positive-arm P terminal
11 negative-arm N terminal
12 AC terminal
13 inner lead
13a extending portion
100 semiconductor device
200 semiconductor device
X first baseline
Y second baseline

What is claimed is:

1. A semiconductor device comprising:
a heat dissipation plate formed in a plate shape;
a plurality of switching elements joined to one surface of the heat dissipation plate;
a first terminal extending in a direction away from the heat dissipation plate in a state of being apart from the heat dissipation plate, the first terminal being connected via a first electric conductor to surfaces of the plurality of switching elements on an opposite side to the heat dissipation plate side;
a sealing member sealing the plurality of switching elements, the heat dissipation plate, and the first terminal; and
a sense element disposed on the one surface of the heat dissipation plate adjacently to the notch, wherein
a notch is provided in an outer periphery portion of the heat dissipation plate, and
a portion of the first terminal on the heat dissipation plate side overlaps with a region of a cut at the notch as seen in a direction perpendicular to the one surface of the heat dissipation plate.

2. The semiconductor device according to claim 1, further comprising:
a second terminal extending in the direction away from the heat dissipation plate in a state of being apart from the heat dissipation plate, the second terminal being connected via a second electric conductor to the sense element, wherein
a portion of the second terminal on the heat dissipation plate side overlaps with the region of the cut at the notch as seen in the direction perpendicular to the one surface of the heat dissipation plate.

3. The semiconductor device according to claim 2, wherein the second electric conductor is a bonding member.

4. The semiconductor device according to claim 1, wherein the plurality of switching elements are arranged in a row so as to straddle the notch, in both-side regions straddling the notch on the one surface of the heat dissipation plate.

5. The semiconductor device according to claim 4, wherein
each of the plurality of switching elements has a gate electrode on the surface thereof on the opposite side to the heat dissipation plate side,
the first terminal and the gate electrode are connected to each other via the first electric conductor, and
the gate electrode, and a portion of the first terminal that is connected to the first electric conductor, are arranged in a row in a direction parallel to the one surface of the heat dissipation plate.

6. The semiconductor device according to claim 5, wherein
in each of a one-side region and an other-side region straddling the notch on the one surface of the heat dissipation plate, the first electric conductor makes connection between the gate electrodes of two respective switching elements adjacent to each other among the switching elements, and the first electric conductor makes connection between the first terminal and each of the gate electrode of one of the switching elements that is disposed in the one-side region adjacently to the notch and the gate electrode of one of the switching elements that is disposed in the other-side region adjacently to the notch.

7. The semiconductor device according to claim 1, comprising two sets each composed of the plurality of switching elements, the heat dissipation plate, and the first terminal, wherein the heat dissipation plate of a first set and the heat dissipation plate of a second set are disposed adjacent to each other on a same plane, the notch of the heat dissipation plate of the first set is provided in an outer periphery portion of the heat dissipation plate of the first set on an opposite side to the heat dissipation plate of the second set, the notch of the heat dissipation plate of the second set is provided in an outer periphery portion of the heat dissipation plate of the second set on an opposite side to the heat dissipation plate of the first set, the first terminal of the first set extends to the opposite side to the heat dissipation plate of the second set, and the first terminal of the second set extends to the opposite side to the heat dissipation plate of the first set.

8. The semiconductor device according to claim 7, further comprising:

an inner lead connecting one surface of the heat dissipation plate of the second set and electrodes provided on surfaces of the switching elements joined to one surface of the heat dissipation plate of the first set, the surfaces being located on the opposite side to the heat dissipation plate side; and a third terminal extending in a direction away from the heat dissipation plate of the first set in a state of being apart from the heat dissipation plate of the first set, wherein the one surface of the heat dissipation plate of the second set is joined to electrodes provided on surfaces of the switching elements on the heat dissipation plate side, the inner lead has an extending portion extending from a body portion of the inner lead to the opposite side to the heat dissipation plate of the second set, the extending portion, and a portion of the third terminal on a side where the heat dissipation plate of the first set is present, are each disposed so as to overlap with a region of a cut at the notch of the heat dissipation plate of the first set as seen in a direction perpendicular to the one surface of the heat dissipation plate of the first set, and the extending portion is connected to the third terminal via a third electric conductor.

9. The semiconductor device according to claim 8, wherein the third electric conductor is a bonding member.

10. The semiconductor device according to claim 1, wherein the first electric conductor is a bonding member.

* * * * *